(12) United States Patent
Richter et al.

(10) Patent No.: US 9,093,598 B2
(45) Date of Patent: Jul. 28, 2015

(54) METHOD OF IN-LINE DIFFUSION FOR SOLAR CELLS

(71) Applicant: BTU International, Inc., No. Billerica, MA (US)

(72) Inventors: Paul J. Richter, Chelmsford, MA (US); Frank Bottari, Acton, MA (US)

(73) Assignee: BTU International, Inc., No. Billerica, MA (US)

( * ) Notice: Subject to any disclaimer, the term of this patent is extended or adjusted under 35 U.S.C. 154(b) by 0 days.

(21) Appl. No.: 13/861,537

(22) Filed: Apr. 12, 2013

(65) Prior Publication Data

US 2014/0308805 A1    Oct. 16, 2014

(51) Int. Cl.
*H01L 21/38* (2006.01)
*H01L 21/22* (2006.01)
*H01L 31/18* (2006.01)
*H01L 21/225* (2006.01)

(52) U.S. Cl.
CPC ............ *H01L 31/18* (2013.01); *H01L 21/2255* (2013.01)

(58) Field of Classification Search
None
See application file for complete search history.

(56) References Cited

U.S. PATENT DOCUMENTS

| | | | | |
|---|---|---|---|---|
| 5,461,002 A | * | 10/1995 | Safir | 438/558 |
| 6,695,903 B1 | * | 2/2004 | Kubelbeck et al. | 106/287.14 |
| 7,923,368 B2 | * | 4/2011 | Terry et al. | 438/660 |
| 8,163,638 B2 | * | 4/2012 | De Ceuster et al. | 438/558 |
| 8,288,193 B2 | * | 10/2012 | Wu et al. | 438/69 |
| 8,409,912 B2 | * | 4/2013 | de Ceuster et al. | 438/98 |
| 8,628,992 B2 | * | 1/2014 | Gabor et al. | 438/57 |
| 8,669,169 B2 | * | 3/2014 | Inns | 438/522 |
| 2004/0112426 A1 | * | 6/2004 | Hagino | 136/261 |
| 2005/0176164 A1 | * | 8/2005 | Gee et al. | 438/48 |
| 2011/0265859 A1 | * | 11/2011 | Safir | 136/249 |

\* cited by examiner

Primary Examiner — Brett Feeney
Assistant Examiner — Khanh Duong
(74) Attorney, Agent, or Firm — Preti Flaherty Beliveau & Pachios LLP

(57) ABSTRACT

A method is provided for the simultaneous diffusion of dopants of different types on respective sides of a solar cell wafer in a single stage process. The dopants are applied to respective sides of the wafer in wet chemical form preferably by pad printing. The doping materials can be applied to the entire wafer surface or effective area thereof, or can be applied in a pattern to suit the intended solar cell configuration. In a typical embodiment, the dopants are boron and phosphorus.

2 Claims, 2 Drawing Sheets

METHOD OF IN-LINE DIFFUSION FOR SOLAR CELLS

STATEMENT REGARDING FEDERALLY SPONSORED RESEARCH OR DEVELOPMENT

N/A

BACKGROUND OF THE INVENTION

This invention generally relates to diffusion processes in silicon. The invention is particularly applicable to crystalline silicon solar cells.

Thermal diffusion is commonly used to form p-n junctions in crystalline silicon solar cells. In p-type silicon, phosphorous is diffused into the bulk silicon to form a junction. In n-type silicon, boron is diffused into the silicon to form a junction. Prior art methods of thermal diffusion include using tube furnaces to provide the heat required to drive dopant atoms into the silicon lattice structure. The dopant can be delivered to the wafer during the diffusion heating using a vapor source such as phosphorous oxychloride for a phosphorous diffusion or boron tribromide for a boron diffusion. To produce a solar cell using n-type silicon, two high-temperature diffusion processes are needed. A boron diffusion is performed on the first surface of the wafer to produce a charge separating emitter field. On the second surface of the wafer, a phosphorous diffusion is carried out to form a deep junction to act as a conductive back surface field (BSF). In conventional practice, these two processes are performed sequentially with discrete machinery which results in long cycle times, expensive capital equipment and operating costs. Also, additional process steps, such as glass removal etching and masking have to be performed during each sequential process which adds to capital, materials and operating expenses.

BRIEF SUMMARY OF THE INVENTION

The present invention provides for the simultaneous diffusion of dopants of different types on respective sides of a solar cell wafer in a single stage process. The dopants are applied to respective sides of the wafer in wet chemical form preferably by pad printing or alternatively by spray coating, dip coating, roll coating, gravure coating, rod coating, ink jet printing, screen printing or other known application techniques. The doping materials can be applied to the entire wafer surface or effective area thereof, or can be applied in a pattern to suit the intended solar cell configuration. In a typical embodiment, the dopants are boron and phosphorus. Other Group III and Group V dopants can also be used as known in the art.

The wet chemical doping materials are inexpensive as are the application techniques noted above. Moreover these wet-chemical coating methods are versatile and can be used singularly, or combined to form either full surface coatings, or patterned depositions for conventional or advanced solar cell constructions. For each coating method, basic dopant source chemistry can be the same but factors such as rheology, drying characteristics, surface wetting and flow control can be chemically altered to produce the desired characteristics.

Further, the junction depths of the two simultaneous diffusions can be controlled semi-independently by the formulation of the dopant chemistries, such as by adjusting the concentration of dopant source element in each dopant. Additionally, retarder layers, such as silica can be disposed under the dopant source and over the silicon wafer and act to impede the diffusion of the dopant into the silicon wafer, thus affecting the depth of diffusion.

After dopant application, both the boron and phosphorous thermal diffusion steps are performed simultaneously in a single in-line furnace. After diffusion, the resultant glass layers on both the boron and phosphorous doped surfaces are then simultaneously removed in a single acid etching process. In these ways, capital equipment, materials, process steps and operating costs are reduced from conventional two stage methods.

The invention is described herein for boron and phosphorus diffusion in a silicon wafer or substrate, but is not limited to these materials. The invention is broadly applicable to simultaneous diffusion of other dopants in a semiconductor wafer such as other Group III and Group V dopants, and to wafers other than silicon.

To prevent the migration of a dopant to be diffused on one side of a wafer to the opposite side on which a different dopant is to be diffused, the invention in one aspect employs a barrier or capping layer over the respective doping layers after they have been dried and before the single diffusion step in which the dopants are simultaneously diffused into respective sides of the wafer.

In another aspect of the invention, the gas flow patterns of the furnace are arranged to isolate the respective dopants and to prevent migration of each dopant to the opposite side of the wafer.

BRIEF DESCRIPTION OF THE SEVERAL VIEWS OF THE DRAWINGS

The invention will be more fully understood from the following detailed description read in conjunction with the accompanying drawings in which.

DETAILED DESCRIPTION

Figure 1:
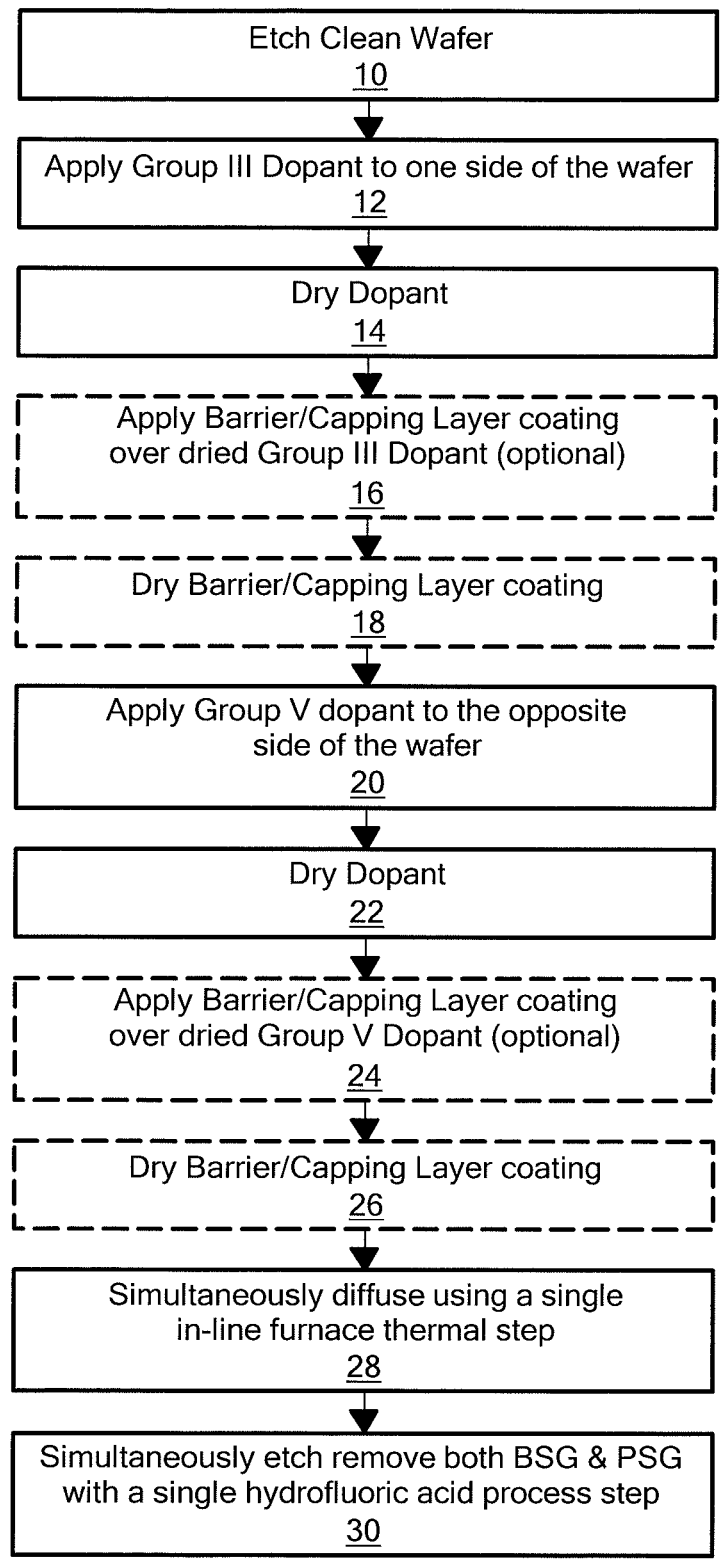
FIG. 1 is a flowchart of a preferred embodiment of the invention.

A preferred embodiment of the invention is illustrated in the flow chart of FIG. 1. As an initial step 10, the wafer is etched clean in, for example, a 10% solution of hydrofluoric acid for one minute followed by deionized water rinse and drying of the wafer surfaces. In step 12, a Group III dopant is applied in wet form to one side of the wafer and in step 14, the dopant is dried. Optionally, in step 16 a barrier/capping layer is coated over the dried Group III dopant and this barrier/capping layer is dried in step 18. In step 20, a Group V dopant is applied to the opposite side of the wafer and this dopant is dried in step 22. Optionally, in step 24, a barrier/capping layer is provided over the dried Group V dopant and this barrier/capping layer is dried in step 26. In step 28, the wafer is heated in an inline furnace to simultaneously diffuse the Group III and Group V dopants into the wafer. In step 30, the diffusion glass layers which form on the wafer surfaces during the heating and diffusion steps are simultaneously removed from respective sides of the wafer. The wafer can thereafter be further processed to form the solar cells.

A pad printing method is particularly desirable for applying wet-chemical doping source chemicals and coatings to silicon solar wafers. This method uses a silicone print pad large enough to completely transfer a full area, or patterned dopant deposition to the solar wafer with a single pad impression. A metal, polymer, or ceramic cliché plate is used to define the deposition image for transfer. Cliché plate depths may be adjusted for the deposition amount desired. Pad printing preferably with a polymer or ceramic cliché plate provides a metal-free application system that can rapidly deposit thin structured coatings of different materials selectively to both wafer surfaces. Pad Printing also is able to produce uniform thin coatings which are conformal to the surface that they are disposed upon. In this way, coating voids are minimized, junction depth uniformity is improved and shorting is reduced.

Further, the junction depths of the two simultaneous diffusions can be controlled semi-independently by the formulation of the dopant chemistries, such as by adjusting the concentration of dopant source element in each dopant. Additionally, retarder layers, such as comprising silica can be disposed under the dopant source and over the silicon wafer and act to impede the diffusion of the dopant into the silicon wafer, thus affecting the depth of diffusion.

Optionally, a barrier, or capping layer may be disposed over either, or both dopant source coatings before co-diffusion to prevent, or reduce contamination by the opposing dopant. These barrier layers may consist of a sol gel derived silica sol, or nano particles and may be applied by the same methods as the doping materials. Another method to prevent cross-contamination of the dopants is to join two, or more wafers together with like dopant surfaces touching each other. These wafers can be temporarily bonded together with a small quantity of an adhesive, such as a silicate which can be dissolved by the post-diffusion glass etch process. Alternately, a mechanical clip, or fixture could be used to hold the wafers together during thermal processing.

Another way that dopant cross-contamination can be reduced in an in-line furnace is to control the airflow within the furnace in order to prevent, or minimize the deposit of airborne opposite dopant contaminants onto wafer surfaces during diffusion. This method uses a differential exhaust flow direction and rate so that gas flow is always away from either side of the wafer. Flow velocity is kept high enough to entrain gaseous, or particulate dopants and direct them away from the wafer thus preventing cross-contamination of phosphorous on the boron doped side and boron on the phosphorous doped side.

Figure 2:
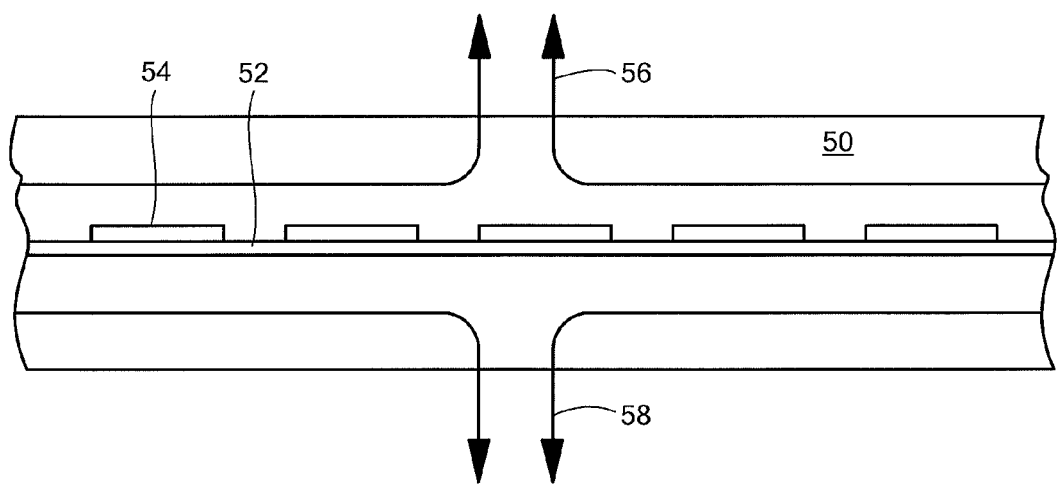
FIG. 2 is a diagrammatic view of a furnace having isolated gas flow paths.

Referring to FIG. 2, there is depicted diagrammatically a furnace chamber 50 through which a conveyor 52 carries silicon wafers 54. An upper gas flow path is illustrated by arrows 56 and provides gas flow away from the top side of the wafer. A lower gas flow path, illustrated by arrows 58, provides gas flow away from the bottom side of the wafer. The techniques for producing such differential gas flow are per as known in the art.

After dopant application, both the boron and phosphorous thermal diffusion steps are performed simultaneously in a single in-line furnace. This in-line furnace may use a metallic conveyor belt made out of a high-temperature resistant material such as Nichrome 5. A disadvantage of using a metallic conveyor belt is that metallic elements from the belt may diffuse into the wafer silicon during the diffusion process and produce carrier lifetime reducing recombination centers. It has been shown that the phosphorous coating on the surface of the wafer in contact with the belt can act as a barrier layer to metallic belt elements before they are diffused into the silicon, and also to getter metal impurities out of the bulk silicon during diffusion. A preferred method of conveying wafers through an in-line diffusion furnace is to use a non-metal conveyance, instead of a metal belt. In this way, no metal touches, or is in close proximity to the wafer which could act as a metallic contamination source. Methods of non-metal conveyances include conveying wafers through the furnace on ceramic rollers and ceramic linked belts. Additionally, ceramic wafer support elements may be conveyed through the furnace and linked together with common drive elements, such as ceramic rope(s) within the hot section of a furnace. If the ceramic wafer support elements are linked together outside of the hot section of a furnace, lower temperature resistant materials may be used as drive elements.

After diffusion, the resultant glass layers on both the boron and phosphorous doped surfaces are then simultaneously removed in a single acid etching process. In these ways, capital, materials, process steps and operating costs are reduced from the prior art method.

This invention offers several advantages, including the following:

1.) Through-put—Improvement of through-put over background art methods is attained by removing a process firing step, or by eliminating a batch diffusion process step. Through-put is further improved over background art methods by allowing wafers to be conveyed through the production process as individual wafers, not loaded into batch carriers, queued for processing and then unloaded from batch carriers after processing. Through-put is even further improved over the conventional method by combining the borosilicate glass and phosphosilicate glass the removal steps into one single process step. Furnace through-put can be improved by using the method where two or more wafers are temporarily joined together with like dopant surfaces touching each other, thus doubling, or more furnace utilization.

2.) Cost of energy usage—The use of in-line co-diffusion can result in a significant cost savings over background art methods. Current methods of tube furnace co-diffusion require long process times. In-line sequential diffusion uses two separate thermal drive-in steps. In-line co-diffusion is a lower cost method requiring only one thermal drive-in step, resulting in lower process energy costs.

3.) Uniformity—Wafer areal uniformity is improved with in-line co-diffusion processing over conventional tube furnace processing. Tube furnace design factors of both thermal uniformity and dopant gas flow are inherently difficult to control diffusion uniformity across the whole area of the wafer. In-line co-diffusion provides both a uniform application of the doping source material and isothermal heating of the wafer which results in more uniform diffusion depths.

4.) Thin wafer processing—Mechanical yield loss requirements are becoming more stringent and industry standard wafer thickness is reducing. In-line co-diffusion processing improves yield factors through reducing handling and process steps.

5.) Less hazardous chemicals—Boron tribromide and phosphorous oxychloride used in traditional tube furnace diffusion processes are hazardous chemicals that require elaborate engineering control measures to provide a safe work environment in the process area. In contrast, the wet chemical diffusion sources used for in-line diffusion contain boron and phosphorus source materials comprising acids, oxides, and precursors to oxides which are inherently less hazardous than the materials commonly used for tube furnace processing. Additionally, the quantities of chemicals used in an in-line diffusion process are much less than used in a traditional process.

6.) Edge Isolation—Using a selective dopant printing method such as: Pad Printing, Screen Printing, Ink Jet Printing, spray coating over a resist pattern, etc., the dopants can be kept sufficiently separated from the edge of a wafer so that no edge isolation process step is required.

7.) Less wafer damage (thermal)—In conventional diffusion processing, two high-temperature thermal processes are used to drive-in the boron and phosphorous dopants, respectively. For conventional diffusion, relatively long process times are required due to the thermal mass of the wafer load and carrier boats. An advantage of using an in-line furnace for co-diffusion is that the firing ramp profiles are easily controllable and there are no wafer carriers used which would increase the system thermal mass. In-line processing using high thermal ramp rates enable relatively short thermal exposures to complete the diffusion drive-in.

8.) Shaping of diffusion profile—Using an in-line furnace for co-diffusion has the advantage of controlling different segments of the thermal profile independently at any point, or points throughout the thermal and cooling profiles. This flexible capability is advantageous for the processing of some materials that may require processing at specific temperatures during different stages of the thermal exposure.

EXAMPLES

Example 1

One embodiment of the present invention includes using a pad printing method to apply wet-chemical doping source chemicals to silicon solar wafers. This method uses a silicone print pad large enough to completely transfer a full area, or patterned dopant image to the solar wafer with a single pad impression. A polymer or ceramic cliché plate is used to define the image for transfer. Cliché plate depths may be adjusted for the deposition desired.

A liquid boron diffusion source formulated for pad print application was prepared by dissolving 22 grams of boric acid into a mixture of 176 grams of 1-Methyl-2-pyrrolidinone, 4 grams of Polyvinylpyrrolidone (360,000 M.W.) and 66 grams of 2-propanol. This formulation was then pad printed on to a 156 mm×156 mm pseudosquare n-type solar wafer using a 50 shore 00 silicone pad and a 50 μm cliché plate. After printing, the coated wafer surface was dried with a hot air gun. Next, using the same pad printer set-up, the opposite side of the wafer was pad print coated with a liquid phosphorous diffusion source prepared by dissolving 13 grams of phosphoric acid into a mixture of 176 grams of 1-Methyl-2-pyrrolidinone, 4 grams of Polyvinylpyrrolidone (360,000 M.W.) and 66 grams of 2-propanol. This coating was then dried with a hot air gun and both coatings were simultaneously diffused into the wafer using a BTU International, Inc. in-line diffusion furnace set for a thermal exposure of 980° C. for 8 minutes. After diffusion, the resultant borosilicate and phosphosilicate glasses were simultaneously removed by etching in a solution of 50% hydrofluoric acid for a period of 1 minute. After etching, sheet resistance measurements were taken on the diffused wafer. The boron diffused side measured 60Ω/☐±2 and the phosphorous diffused side measured 12Ω/☐±0.5.

Example 2

Another embodiment of the present invention includes using a pad printing method to apply water based wet-chemical doping source chemicals to silicon solar wafers. This method uses a silicone print pad large enough to completely transfer a full area, or patterned dopant image to the solar wafer with a single pad impression. A polymer or ceramic cliché plate is used to define the image for transfer. Cliché plate depths may be adjusted for the deposition desired.

A water-based liquid boron diffusion source formulated for pad print application was prepared by dissolving 20 grams of boric acid into a mixture of 150 grams of hot distilled water and 120 grams of sucrose.

This formulation was then pad printed on to a 156 mm×156 mm pseudosquare n-type solar wafer using a 50 shore 00 silicone pad and a 50 μm cliché plate. After printing, the coated wafer surface was dried with a hot air gun. Next, using the same pad printer set-up, the opposite side of the wafer was pad print coated with a water-based liquid phosphorous diffusion source formulated for pad print application and prepared by dissolving 15 grams of phosphoric acid into a mixture of 100 grams of distilled water and 123 grams of sucrose.

This coating was then dried with a hot air gun and both coatings were simultaneously diffused into the wafer using a BTU International, Inc. in-line diffusion furnace set for a thermal exposure of 980° C. for 8 minutes. After diffusion, the resultant borosilicate and phosphosilicate glasses were simultaneously removed by etching in a solution of 50% hydrofluoric acid for a period of 1 minute. After etching, sheet resistance measurements were taken on the diffused wafer. The boron diffused side measured 59Ω/☐±2 and the phosphorous diffused side measured 14Ω/☐±1.

Example 3

Another embodiment of the present invention includes using a spray method to apply wet-chemical doping source chemicals to silicon solar wafers. In this example, a SonoTek, Inc. ultrasonic spray system was used to coat dopant materials on both surfaces of the wafer.

A liquid diffusion source formulated for spray application was prepared by dissolving 20 grams of boric acid into a solvent mixture of 450 grams of 2-propanol and 50 grams of diethylene glycol mono butyl ether, heated to about 80° C.

This formulation was then spray coated on to a 156 mm×156 mm pseudosquare n-type solar wafer. After coating, the coated wafer surface was dried with a hot air gun. Next, the opposite side of the wafer was spray coated with a liquid phosphorous diffusion source formulated for spray application and prepared by mixing, by volume, 6 milliliters of phosphoric acid into 200 milliliters of 2-propanol.

This coating was then dried with a hot air gun and both coatings were simultaneously diffused into the wafer using a BTU International, Inc. in-line diffusion furnace set for a thermal exposure of 980° C. for 8 minutes. After diffusion, the resultant borosilicate and phosphosilicate glasses were simultaneously removed by etching in a solution of 50% hydrofluoric acid for a period of 1 minute. After etching, sheet resistance measurements were taken on the diffused wafer. The boron diffused side measured 60Ω/☐±2 and the phosphorous diffused side measured 12Ω/☐±1.

The invention is not to be limited by what has been particularly shown and described and is to embrace the spirit and full scope of the appended claims.

The invention claimed is:

1. A method of simultaneously diffusing dopants of different types on respective sides of a silicon wafer comprising the steps of:
   applying a first liquid doping material to a first side of the wafer;
   applying a second liquid doping material different from the first liquid doping material to a second side of the wafer; and heating the wafer to diffuse simultaneously the first liquid doping material into the first side of the wafer and the second liquid doping material into the second side of the wafer;

wherein the first liquid doping material includes a Group III dopant; and wherein the first liquid doping material is a solution comprising boric acid, 1-methyl, 2-pyrrolidinone, polyvinylpyrrolidone, and 2-propanol.

2. A method of simultaneously diffusing dopants of different types on respective sides of a silicon wafer comprising the steps of:

applying a first liquid doping material to a first side of the wafer;

applying a second liquid doping material different from the first liquid doping material to a side of the wafer; and heating the wafer to diffuse simultaneously the first liquid doping material into the first side of the wafer and the second liquid doping material into the second side of the wafer;

wherein the first liquid doping material includes a Group III dopant; and wherein the second liquid doping material is a solution comprising phosphoric acid, 1-methyl-2-pyrrolidinone, polyvinylpyrrolidone and 2-propanol.

* * * * *